United States Patent [19]
Nishida et al.

[11] Patent Number: 4,939,497
[45] Date of Patent: Jul. 3, 1990

[54] PRESSURE SENSOR

[75] Inventors: Minoru Nishida, Okazaki; Yosiyasu Ando, Nishio; Tadashi Hattori; Youiti Kotanishi, both of Okazaki, all of Japan

[73] Assignee: Nippon Soken, Inc., Nishio, Japan

[21] Appl. No.: 339,826

[22] Filed: Apr. 18, 1989

[51] Int. Cl.$^5$ ............................................. G01L 1/22
[52] U.S. Cl. .......................................... 338/4; 338/5; 338/42; 73/720; 73/721
[58] Field of Search ......................................... 338/2–5, 338/42; 73/706, 720, 721, 726

[56] References Cited

U.S. PATENT DOCUMENTS

| | | | |
|---|---|---|---|
| 4,382,377 | 5/1983 | Kleinschmidt et al. | 73/35 |
| 4,500,864 | 2/1985 | Nakane et al. | 338/4 |
| 4,502,335 | 3/1985 | Wamstad et al. | 338/4 X |
| 4,653,329 | 3/1987 | Sagara et al. | 338/4 X |
| 4,712,082 | 12/1987 | Ito et al. | 338/4 |
| 4,722,227 | 2/1988 | Grob et al. | 338/4 X |

FOREIGN PATENT DOCUMENTS

| | | |
|---|---|---|
| 58-5372 | 1/1983 | Japan . |
| 60-247129 | 12/1985 | Japan . |
| 61-217733 | 9/1986 | Japan . |
| 62-73131 | 4/1987 | Japan . |

Primary Examiner—Bruce A. Reynolds
Assistant Examiner—Marvin M. Lateef
Attorney, Agent, or Firm—Cushman, Darby & Cushman

[57] ABSTRACT

The pressure sensor has a housing, a sensing body mounted inside an internal space of the housing and having a cavity, one end thereof being open and other end thereof being closed, to form a pressure introducing portion therein, the closed end thereof having a thin thickness forming a diaphragm for receiving a pressure, and a semiconductor chip mounted on one surface of the closed end opposite to the diaphragm for receiving a pressure. The pressure sensor is characterized in that the sensing body is attenuated at a portion including at least the closed end thereof and has a diameter smaller than that of the remaining portion thereof, and a shoulder is provided therebetween, whereby the sensing body is fixedly connected to the internal space of said housing by abutting the shoulder thereof against a stopper portion provided in the internal space of the housing and the external surface thereof is placed in contact with the inner surface of the internal space of the housing. The pressure sensor having the above construction is highly sensitive and can accurately measure a pressure of a high pressure fluid, as the sensing body is firmly fixed to the inner surface of the housing and has a simple construction.

10 Claims, 8 Drawing Sheets

PRESSURE SENSOR

BACKGROUND OF THE INVENTION

1. Field of the Invention

This invention relates to a pressure sensor, more particularly to a pressure sensor having a high sensitivity and able to accurately detect a pressure of a high pressure fluid.

2. Description of the Related Art

A known pressure sensor used for the above purpose comprises a cylindrical detecting housing having an internal space therein, a cylindrical sensing body provided inside the internal space of the housing and having a cavity therein, one end of which is closed, a diaphragm provided at the closed end of the cavity, and a strain gauge made of a semiconductor or the like mounted on one surface of the closed end of the cavity opposite to the surface thereof which is subjected to a pressure.

The pressure sensor mentioned above is used to measure a pressure by allowing a pressurized medium to be introduced into the cavity portion from an open end of the sensing body and impinged on the diaphragm, whereby the pressure on the sensing body is detected by using the strain gauge to measure the amount of the strain imposed on the diaphragm.

In this kind of pressure sensor, the contacting portion formed between the sensing body and the housing is usually fixed by welding, and therefore problems such as a reduction of the sealing ability of the welded portion due to corrosion, a breakage of the welded portion caused by the high pressure imposed on the entire sensing body, especially when measuring a high pressure fluid, and a displacement of the sensing body, or in the worst case, a detachment thereof from the housing, arise, and therefore, this type of pressure sensor is not reliable when used for detecting a pressure of a high pressure liquid, due to an uncertain sealing ability which renders the sensor unsafe.

SUMMARY OF THE INVENTION

Therefore, the object of this invention is to provide a pressure sensor used for detecting a high pressure with a high reliability.

Thus, according to the present invention, there is provided a pressure sensor which comprises a housing having an internal space therein, a sensing body mounted inside the internal space of the housing and provided with a cavity having one end open and other end closed, to form a pressure introducing portion P therein. The closed end of the cavity has a thin thickness portion forming a diaphragm for receiving a pressure, and a semiconductor chip 3 including a strain gauge therein is mounted on one surface of the closed end of the cavity opposite to a surface on which a pressure is imposed. This pressure sensor is further characterized in that the sensing body is attenuated at a portion including at least the closed end thereof and has a diameter smaller than the remaining portion of the sensing body, and has formed therebetween. The sensing body is fixedly connected to the internal space of said housing by contact between the shoulder thereof and a stopper provided inside the internal space of the housing and contact between the external surface thereof and the inner surface of the internal space of the housing corresponding thereto.

In this invention, the semiconductor chip is provided with a strain gauge made of, for example, a piezoelectric, or pieroresistive element.

Further, the shoulder of the sensing body can be formed as a step portion or a tapered portion.

According this invention, the sensing body is firmly fixed to the housing and the shoulder provided on an external surface of the sensing body is abutted against the stopper projected from the inner surface of the housing, and therefore, the sensing body will not be displaced when a high pressure fluid is introduced into the sensing body through the pressure introducing portion thereof.

Moreover, even if the contact between the sensing body and the housing is broken due to an excessive high pressure introduced therein, the sensing body will not be detached from the housing, and accordingly, the sealing ability against a high pressure fluid, and thus the safety characteristics of the sensor, are remarkably improved and the pressure sensor can be used for detecting a pressure of a high pressure fluid with a high reliability.

DESCRIPTION OF THE PREFERRED EMBODIMENTS

A description of this invention will be given hereunder with reference to the accompanying drawings.

Figure 1:
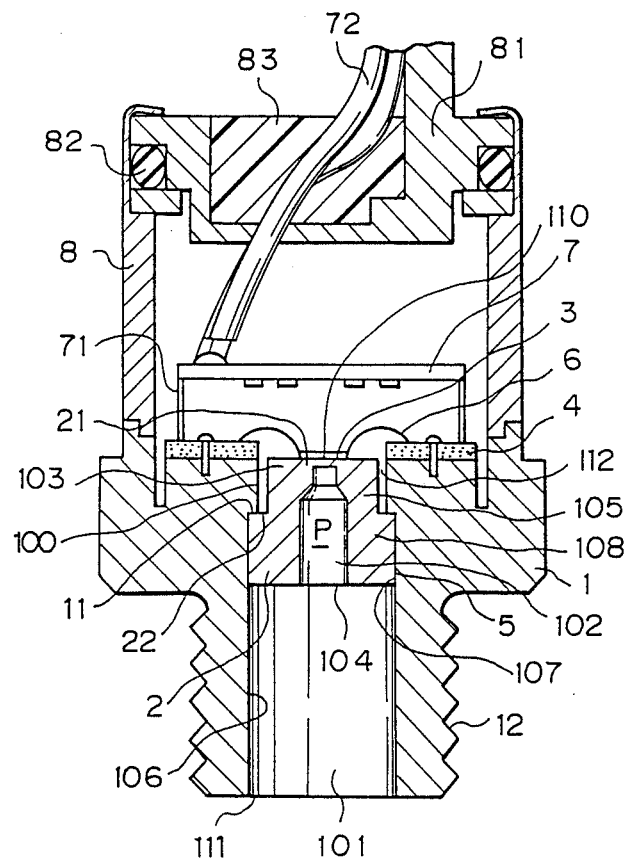
FIG. 1 is a cross sectional view of a first embodiment of the pressure sensor of this invention.

FIG. 1 shows a first embodiment of the pressure sensor of this invention, wherein the pressure sensor has a housing 1 having a cylindrical configuration and provided with an aperture forming an internal space 101 in the center portion thereof. The external portion of an upper half of the housing has a large diameter and is formed in a hexagonal shape in cross section, and a fitting screw thread 12 is provided on the external surface of the lower half of the housing 1.

As shown in FIG. 1, a sensing body 2 is inserted in the internal space 101 of the housing 1, this sensing body 2 being provided with a cavity 102 having one end 104 open and other end 103 closed, to form a pressure introducing portion the sensing body 2.

Further, a shoulder 22 is formed on the external surface around a center portion the sensing body 2, to divide the sensing body 2 into two portions, i.e. an upper half 105 encompassing the closed end of the cavity 102 from the center of the sensing body 2, and a lower half 108. The upper half 105 of the sensing body 2 has a smaller diameter than that of the lower half 108, to thus form an attenuated portion of the sensing body 2.

A stopper 11 is provided in the form of a lip projecting from the inner surface of the internal space of the housing 1 at, for example, a position close to the upper end of the internal space 101, whereby upward movement of the sensing body 2 is stopped by an abutting of the shoulder 22 against the stopper 11.

The external surface of the lower half 108 of the sensing body 2 having a larger diameter is hermetically connected to the inner surface of the internal space 101 of the housing 1 by a nickel brazed layer 5 fixed therebetween.

The sensing body 2 is preferably made of an Fe-Ni-Co alloy having a low coefficient of thermal expansion, and the closed end 103 is provided in the center thereof with a portion 110 having a thin thickness and acting as a diaphragm 21 which receives a pressure to be measured.

Figure 2:
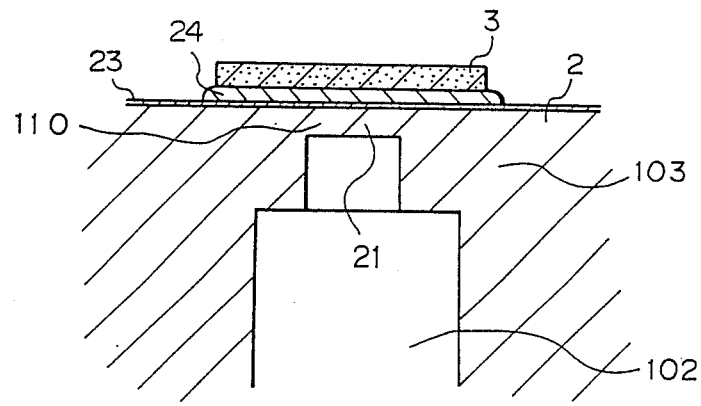
FIG. 2 is a partial cross sectional view showing the connection between the semiconductor chip and the sensing body.

As shown in FIG. 2, an oxidized layer 23 is formed by an oxidizing method over the whole upper surface of the diaphragm 21, and a semiconductor chip 3 is provided on the oxidized layer 23 with a glass layer 24 having low melting point arranged therebetween. Further, as shown in FIG. 1, components used for measuring a pressure imposed on the chip 3 are electrically connected by wire 6 to electrodes provided on a ring-like ceramic substrate 4 provided, for example, on the upper surface of the housing 1 and encircling the chip 3. Further, a ceramic substrate 7, on which an IC circuit for processing the signals output from the semiconductor chip 3 is formed, is provided on the semiconductor chip 3 and the signal processing IC circuit formed on the substrate 7 is connected to electrodes provided on the substrate 4, through pins 71 holding the ceramic substrate 7 above the chip 3.

A cylindrical cover 8 is connected to the external upper surface of the housing 1 and a lead holder 81 is hermetically fitted in an aperture at the top of the cover 8, and accordingly, a lead wire 72 extending from the substrate 7 is penetrated through the holder 81 and extended outside the pressure sensor.

A seal ring 82 and a sealing resin 83 are filled in the cover 8 to hermetically seal and hold the holder 81 therein.

The semiconductor chip 3 used in this invention serves as a pressure sensor gauge, and may be composed of a strain gauge, for example, a semiconductor strain gauge, or the like. In this invention the semiconductor chip 3 per se may be a semiconductor strain gauge.

Figure 3:
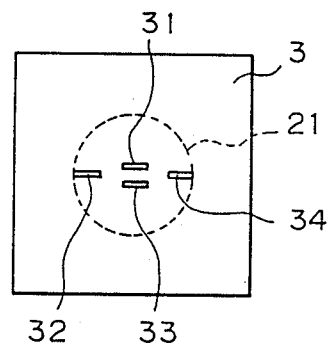
FIG. 3 is a plane view of a first embodiment of the semiconductor chip used in this invention.
Figure 4:
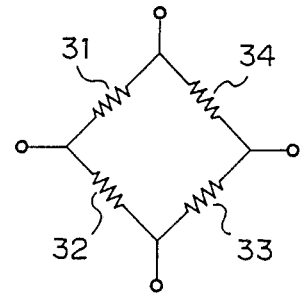
FIG. 4 is a schematic view of the arrangement of the components used in the semiconductor chip shown in FIG. 3, and the wiring thereof.

A construction of the semiconductor chip 3 used in this invention is shown in FIG. 3, wherein a plurality of strain gauge elements, FIG. 3 shows four elements 31, 32, 33, and 34, made of a P type semiconductor are formed on the surface of a silicon substrate by doping Boron into the silicon substrate. As shown in FIG. 3, the elements 31 and 33 are positioned at the upper portion of the center of the diaphragm 21 and the elements 31 and 34 are positioned at the upper portion of the external edge of the diaphragm 21. These elements 31 to 34 are interconnected by lead wires and electrodes (not shown) formed on the silicon substrate, to form a bridge circuit as shown in FIG. 4.

Figure 5:
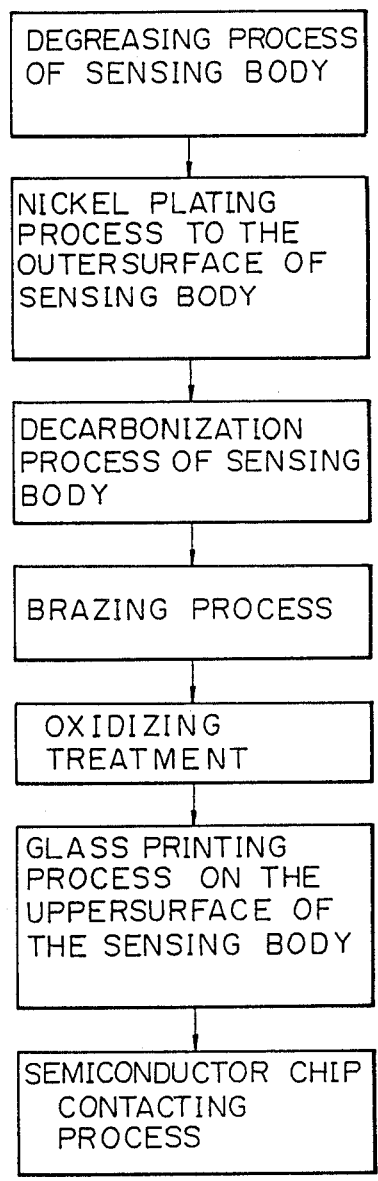
FIG. 5 is a block diagram of one example of the process of the connection method of this invention.

The assembly of the sensing body 2 and the housing 1 and the contact between the housing 1 and the semiconductor chip 3 are carried out by the procedures shown in FIG. 5.

As shown in FIG. 5, first the external surface of the sensing body 2 is degreased by an acid cleaning method and then plated by a nickel plating process. Then, a decarbonizing treatment for decarbonizing the surface of the sensing body 2 is carried out at a temperature of from 800° to 1100° C. for about one hour in an atmosphere of a mixed gas composed of $H_2$ gas and $N_2$ gas having a reduction or mild reduction characteristic, while supplying steam thereto.

Thereafter, the treated sensing body 2 is inserted into the housing 1 and the contacting portions thereof are brazed, i.e., nickel brazing solder is filled into the gap between the housing 1 and the sensing body 2 and heated at a temperature of from 1000° to 1100° C. under a vacuum.

When carrying out this process, preferably a gap 112 is provided between the external surface of the upper portion 105 of the sensing body 2 and the inner surface 100 of the internal space 101 of the housing 1, to prevent strain due to this treatment from affecting the diaphragm 21.

The sensing body 2 thus-integrated with the housing 1 by brazing, is subjected to an acid treatment and then an oxide layer 23 having the thickness of 1.5-5.5 micrometers is formed thereon by exposing same to an $O_2$ atmosphere at 800° C. for 10 minutes, or at 1000° C. for 0.5 minute.

Then the glass layer 24 is formed by first printing a glass paste, obtained by, for example, mixing glass particles in an organic solvent on the oxide layer 23 and carrying out a preliminary heating of the glass to about 450° C., to reduce the thickness of the glass layer to 40-60 micrometers, and finally, the glass layer 24 thus formed is heated to about 450° C. while the semiconductor 3 is mounted thereon, to firmly fix the semiconductor 3 to the sensing body 2.

In the pressure sensor having a construction as described above, when the diaphragm 21 is deformed by a pressure impinging thereon, a strain stress is generated at the semiconductor chip 3 integrally attached to the diaphragm 21, and the resistance of the strain gauge elements 31 and 33 provided on the semiconductor chip will be largely varied to generate output signals corresponding to the pressure thereon. Namely the pressure sensor is highly sensitive, and this is able to accurately measure a pressure of a high pressure liquid.

During this operation, the connecting portion formed between the sensing body 2 and the housing 1 is subjected to a heavy load due to pressure exerted thereon by the high pressure fluid, but according to the pressure sensor of this invention, a displacement or detachment of the sensing body 2 from the housing 1 is prevented because the sensing body 2 is firmly and hermetically fixed to the housing by brazing, and further, the sensing body 2 is supported in the housing 1 by the abutting of the shoulder 22 against the stopper 11.

Furthermore, since the connecting portion formed between the housing 1 and the sensing body 2 is provided by brazing, the open end 108 of the sensing body 2 need not be extended to the entrance 111 of the internal space 110 of the housing 101, and thus the production cost thereof is reduced because the overall size of the sensing body 2 is reduced.

In this embodiment, any kind of pressure sensor gauge, for example, a piezoelectric or piezoresistance strain gauge, can be used instead of the semiconductor strain gauge element.

Also, although the shoulder 22 provided on the external surface of the sensing body 2 has a step-like shape in this embodiment, this shoulder 22 can have a tapered form or a combination of a step and taper form.

As mentioned above, the sensing body 2 used in this invention is provided with an attenuated upper portion 105 including at least the closed end portion 103 thereof, due to the formation of the shoulder 22, and having a diameter smaller than that of the lower portion 108.

Further, in this embodiment, the external diameter of the attenuated upper portion 105 of the sensing body 2 preferably is smaller than the inner diameter of the internal space 101 of the housing 1 in which the attenuated upper portion 105 is fitted, where a gap 112 is provided between the external surface of the attenuated upper portion 105 and the inner surface of the internal space 101 of the housing 1.

The second embodiment of this invention will be explained hereunder with reference to FIG. 6.

Figure 6:
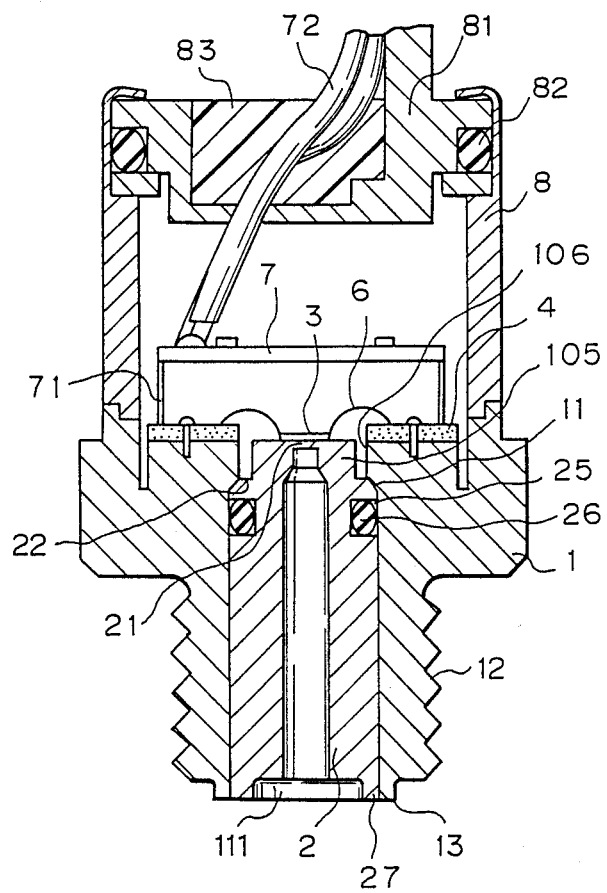
FIG. 6 is a cross sectional view of a second embodiment of the pressure sensor.

In FIG. 6, the attenuated upper portion 105 of the sensing body 2 is provided with a tapered shoulder 22 between the attenuated upper portion 105 and the lower portion 108 thereof, which shoulder 22 abuts against a stopper 11 projected from the inner surface 106 of the internal space 101 of the housing 1.

A groove 25 is formed in the sensing body 2, and an O-ring 26 inserted therein for sealing the gap between the housing 1 and the sensing body 2.

In this embodiment, the lower portion 108 of the sensing body 2 is extended to the open end 111 of the housing 1 and the circumferential edge of the lowest portion of the sensing body 2 is projected to form a flange 27 which is fixed to a flange 13 provided on the circumferential edge of the lowest portion of the housing 1, by welding.

In the construction explained above, since the gap between the sensing body 2 and the housing 1 is twice sealed by the O-ring 26 and the welding, even if the welded portion thereof is broken, the sealing ability remains effective due to the O-ring 26.

In this embodiment, the groove 25 is formed only in the lower portion 108 of the sensing body 2 having a larger diameter, but this groove 25 can be formed in the attenuated portion 105 or can be formed in the surface of the attenuated portion 105 and in the lower portion 108 having a larger diameter, and an O-ring may be inserted into the grooves to provide a sealing between the sensing body 2 and the housing 1.

The third embodiment of this invention will be described hereunder with reference to FIGS. 7 and 8.

Figure 7:
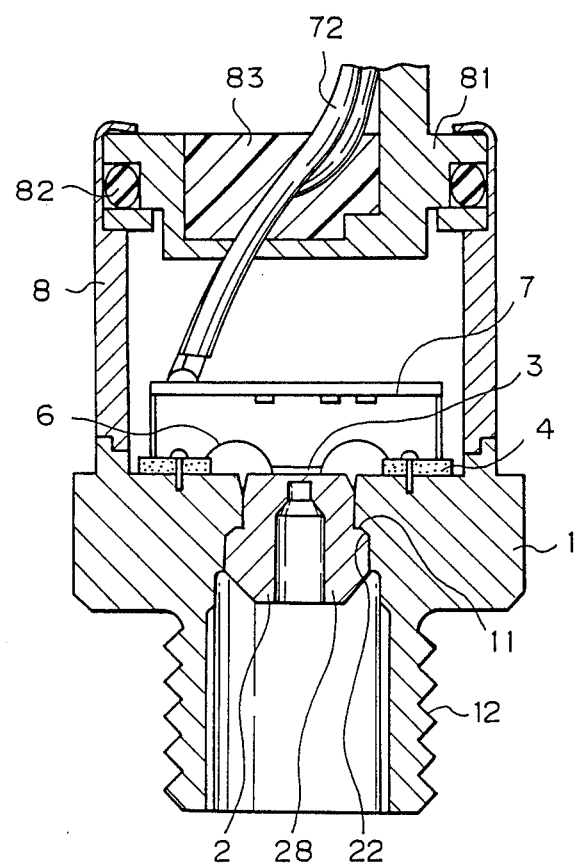
FIG. 7 is a cross sectional view of a third embodiment of the pressure sensor of this invention.

In FIG. 7, the upper attenuated portion 105 of the sensing body 2 is provided with a tapered shoulder portion 22 between the attenuated upper portion 105 and the lower portion 108. The lower portion 28 of the sensing body 2 is also provided with a tapered configuration.

Figure 8:
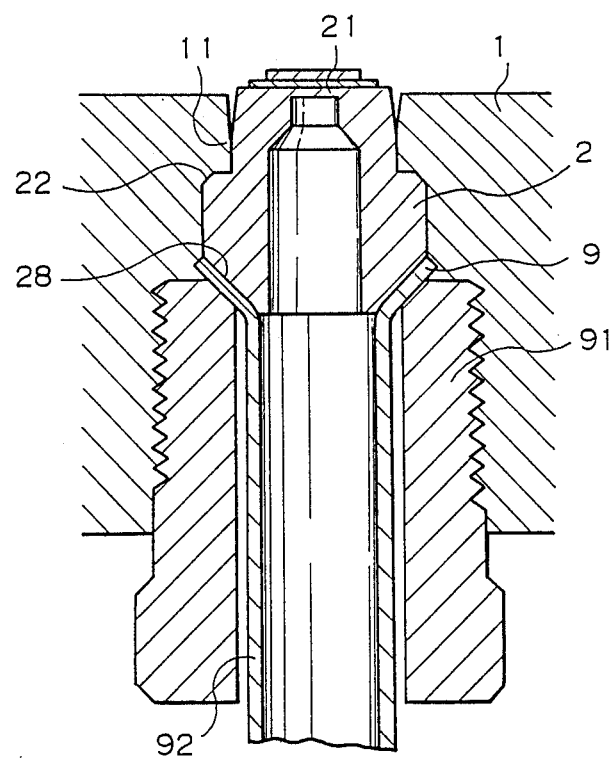
FIG. 8 is a partial cross sectional view showing the connection between the semiconductor chip and the sensing body.

Further, a pressure introducing pipe 92, one end thereof having a tapered configuration 9 and the other end thereof (not shown) being connected to a body containing a medium to be detected, is also provided inside the housing 1, as shown in FIG. 8, and the sensing body 2 is fixedly connected to the inner surface 106 of the internal space 101 of the housing 1 and in contact with the tapered end portion 9 of the pipe 92. The tapered end 9 is pressed against the tapered end 28 of the sensing body 2 by a external-thread socket nut 91 provided on the external surface of the pipe 92 for fastening the tapered end 9 by a screw thread 12.

Namely, as shown in FIG. 8, the inner surface 106 of the lower portion of the housing 1 is provided with a screw thread for securing the socket nut 91, whereby, the socket nut 91 is inserted into the internal space 101 of the housing 1 from the lower end thereof and screwed therein and thus the sensing body 2 is tightly fixed to the inner surface of the housing 1 by the socket nut 91 while the tapered portion 9 of the pipe 92 is located therebetween, and simultaneously, the gap between the housing 1 and the sensing body 2 is hermetically sealed.

The fourth embodiment of this invention will be described hereunder with reference to FIGS. 9 and 10.

Figure 9A:
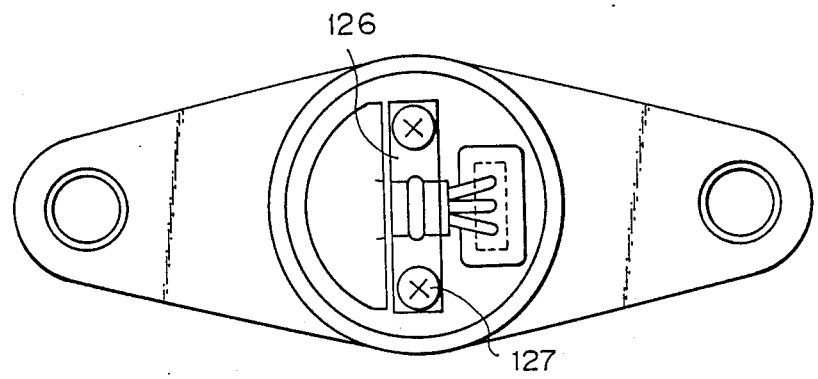
FIG. 9(A) is a top plane view of the pressure sensor of the fourth embodiment of the pressure sensor of this invention.
Figure 9B:
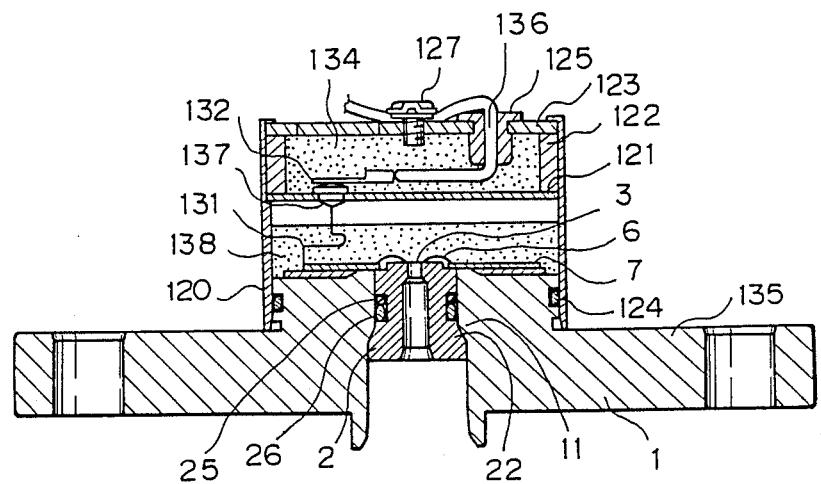
FIG. 9(B) is a cross sectional view of the pressure sensor shown in FIG. 9(A); and, FIG. 10 is a cross sectional view of the pressure sensor shown in FIG. 9(B), when connected to the main body of the device containing the high pressure fluid.

FIG. 9(A) is a plane view, and FIG. 9(B) is a cross sectional view, of the pressure sensor of this embodiment.

As shown in FIG. 9(B), the housing 1 is formed integrally with a flange 135 and the external surface of the sensing body 2 is provided with a tapered projecting portion 22 which abuts against a tapered stopper 11 provided on the inner surface 106 of the internal space 101 of the housing 1.

A groove 25 for holding an O-ring is provided in the sensing body 2 above the tapered projecting portion 22, and the semiconductor chip 3 is attached to the top surface of the sensing body 2 and electrically connected by wires 6 to a ceramic substrate 7 mounted on the housing 1.

The circuit formed on the ceramic substrate 7 is electrically connected to the outside components by a lead 136 through a lead frame 131.

A cover 120 is fitted on the housing 1 and sealing is provided by an O-ring 124.

A plate 121 having an aperture 137 is fixed to the cover 120 with a pressure ring 122 and a upper plate 123 and a feedthrough capacitor 132 for eliminating electrical noise or the like, are mounted in the aperture 137. The feedthrough capacitor 132 and the lead frame 131 are electrically connected by soldering.

A lead holder 125, a lead press 126, a crew 127, silicon gel 138, for protecting the silicon chip from the atmosphere, and a potting material 134 for protecting the lead and the feedthrough capacitor 132 are also provided in this embodiment.

In this embodiment, the sensing body 2 is press-fitted into the housing 1 by hammering, and accordingly, the sensing body 2 cannot rotate, and further, the groove 25 for holding the O-ring 26 prevents stress caused by the hammering process from affecting the semiconductor chip.

Accordingly, in this embodiment, the sensing body 2 can be brought into contact with the housing without welding, to thereby simplify the assembly thereof.

Figure 10:
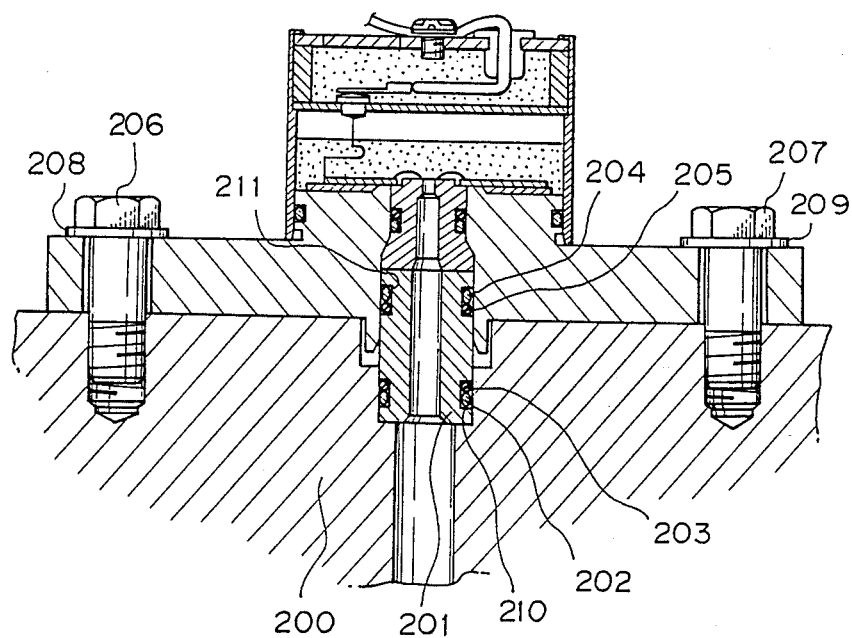

In FIG. 10, the pressure sensor of this embodiment is shown when assembled to the main body.

The housing 1 in enclosed in a seal pipe 201 which is inserted in to main body 200, for example, a container containing a high pressure medium. One end of the seal pipe 201 is in contact with the open end of the sensing body 2 mounted in the housing 1 of the pressure sensor, and the seal pipe 201 is provided with the grooves 210 and 211 in the surface thereof.

Accordingly, a gap between the seal pipe 201 and the housing 1 is sealed by an O-ring 204 and a backup ring 205 provided in the groove 211, and by an O-ring 202 and backup ring 203 provided in the groove 210. The pressure sensor 1 is fixedly mounted on the main body 200 by bolts 206 and 207 and washers 208 and 209, respectively.

In the above embodiments, the grooves are preferably provided in the sensing body between the closed end of the sensing body and the shoulder, as this will reduce stress generated on the shoulder when the sensing body is hammered into the housing, and therefore, stress affecting the semiconductor chip is suppressed and the sensitivity of the sensor increased.

Further, the grooves can be formed in a conventional manner, and thus no special step is needed for this process, whereby the production costs are not increased.

We claim:

1. A pressure sensor which comprises:
 a housing having an internal space therein,
 a sensing body mounted inside said internal space of said housing and provided with a cavity, one end thereof being open and other end thereof being closed, as a pressure introducing portion, said closed end thereof having a thin thickness forming a diaphragm for receiving a pressure, and
 a semiconductor chip including a strain gauge therein mounted on one surface of said closed end opposite to said diaphragm for receiving the pressure,
 said pressure sensor being characterized in that said sensing body is attenuated at a portion including at least said closed end thereof and has a diameter smaller than that of the remaining portion thereof and a shoulder is provided therebetween, said sensing body being fixedly connected to said internal space of said housing by abutting said shoulder thereof against a stopper provided in said internal space of said housing and placing the external surface thereof in contact with the inner surface of said internal space of said housing, whereby movement of the sensor body toward said closed end is prevented by said abutting of the shoulder against the stopper.

2. A pressure sensor which comprises:
 a housing having an internal space therein,
 a sensing body mounted inside said internal space of said housing and provided with a cavity, one end thereof being open and other end thereof being closed, as a pressure introducing portion, said closed end thereof having a thin thickness forming a diaphragm for receiving a pressure, and
 a semiconductor chip including a strain gauge therein mounted on one surface of said closed end opposite to said diaphragm for receiving the pressure,
 said pressure sensor being characterized in that said sensing body is attenuated at a portion including at least said closed end thereof and has a diameter smaller than that of the remaining portion thereof and a shoulder is provided therebetween, a groove being provided in said sensing body and said sensing body is fixedly connected to said internal spaced of said housing by abutting said shoulder thereof against a stopper provided in said internal space of said housing and placing the external surface thereof in contact with the inner surface of said internal space of said housing, whereby movement of the sensor body toward said closed end is prevented by said abutting of the shoulder against the stopper.

3. A pressure sensor according to claim 2, wherein said groove is provided in said attenuated portion.

4. A pressure sensor according to claim 2, wherein an O-ring is provided inside said groove.

5. A pressure sensor according to claim 3, wherein an O-ring is provided inside said groove.

6. A pressure sensor according to claim 1, wherein said external surface of said sensing body is fixedly connected to the inner surface of the internal space of said housing by soldering.

7. A pressure sensor according to claim 1, wherein said open end of said sensing body is fixedly connected to said internal space of said housing by welding.

8. A pressure sensor according to claim 1, wherein said sensing body is press-fitted in the internal space of said housing by hammering.

9. A pressure sensor according to claim 1, wherein said external diameter of said attenuated portion of said sensing body is smaller than the inner diameter of a portion of said internal space of said housing opposite to the external surface of said attenuated portion, so that a gap is provided between the external surface of said attenuated portion and the inner surface of said internal space of said housing.

10. A pressure sensor according to claim 1, wherein said open end of said sensing body is tapered and a pressure introducing pipe, one end portion thereof being tapered and the other end thereof being connected to a body containing a high pressure medium is also provided inside said housing, said pressure sensor being further characterized in that said sensing body is fixedly connected to the inner surface of said internal space of said housing in contact with said tapered end of said pipe, said tapered end thereof being pressed against said tapered end of said sensing body by screwing down a socket nut provided on the external surface of said pipe and fastened to the internal space of said housing by a screw thread.

* * * * *